United States Patent
Shin et al.

(10) Patent No.: US 11,367,742 B2
(45) Date of Patent: Jun. 21, 2022

(54) DISPLAY PANEL AND METHOD OF FABRICATING THE SAME

(71) Applicant: Samsung Display Co., Ltd., Yongin-si (KR)

(72) Inventors: Hyuneok Shin, Gwacheon-si (KR); Kyeongsu Ko, Hwaseong-si (KR); Sanggab Kim, Seoul (KR); Hongsick Park, Suwon-si (KR); Sangwoo Sohn, Yongin-si (KR); Dokeun Song, Seongnam-si (KR); Sangwon Shin, Yongin-si (KR); Sukyoung Yang, Hwaseong-si (KR); Dongmin Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/544,602

(22) Filed: Aug. 19, 2019

(65) Prior Publication Data
US 2020/0119058 A1  Apr. 16, 2020

(30) Foreign Application Priority Data
Oct. 16, 2018 (KR) .................. 10-2018-0122876

(51) Int. Cl.
*H01L 27/12* (2006.01)

(52) U.S. Cl.
CPC ........ *H01L 27/1255* (2013.01); *H01L 27/124* (2013.01); *H01L 27/127* (2013.01); *H01L 27/1218* (2013.01)

(58) Field of Classification Search
CPC . H01L 27/124; H01L 27/127; H01L 27/1218; H01L 27/3276; H01L 27/1255
See application file for complete search history.

(56) References Cited

U.S. PATENT DOCUMENTS

| | | | |
|---|---|---|---|
| 6,255,596 B1* | 7/2001 | Hosono | H01L 39/14 505/231 |
| 8,558,230 B2 | 10/2013 | Lee et al. | |
| 2006/0050192 A1* | 3/2006 | Cho | H01L 27/3276 349/42 |
| 2007/0052099 A1* | 3/2007 | Carroll | H01L 24/13 257/E23.021 |
| 2016/0181387 A1* | 6/2016 | Kim | H01L 27/1248 257/72 |
| 2018/0373202 A1* | 12/2018 | Charbon | G04B 1/14 |

FOREIGN PATENT DOCUMENTS

| | | |
|---|---|---|
| JP | 2944336 | 9/1999 |
| JP | 3302894 | 7/2002 |
| KR | 10-2013-0066410 | 6/2013 |
| KR | 10-1579453 | 12/2015 |

* cited by examiner

*Primary Examiner* — Vongsavanh Sengdara
(74) *Attorney, Agent, or Firm* — H.C. Park & Associates, PLC

(57) ABSTRACT

A display panel includes: a base layer; a signal line disposed on the base layer, the signal line including: a first layer including aluminum; and a second layer directly disposed on the first layer, the second layer including a niobium-titanium alloy; a first thin film transistor connected to the signal line; a second thin film transistor disposed on the base layer; a capacitor electrically connected to the second thin film transistor; and a light emitting element electrically connected to the second thin film transistor.

15 Claims, 12 Drawing Sheets

FIG. 6B

| Ti Content (at%) | Spray Method | | Dip Method | |
|---|---|---|---|---|
| 5 | CL-1 {CL2, CL1}, IL | IL, CL2 | CL-1 {CL2, CL1}, IL | IL, CL2 |
| 10 | CL-1 {CL2, CL1}, IL | IL, CL2 | CL-1 {CL2, CL1}, IL | IL, CL2 |
| 20 | CL-1 {CL2, CL1}, IL | IL, CL2 | CL-1 {CL2, CL1}, IL | IL, CL2 |
| 50 | CL-1 {CL2, CL1}, IL | IL, CL2 | CL-1 {CL2, CL1}, IL | IL, CL2 |

DISPLAY PANEL AND METHOD OF FABRICATING THE SAME

CROSS-REFERENCE TO RELATED APPLICATION

This application claims priority from and the benefit of Korean Patent Application No. 10-2018-0122876, filed on Oct. 16, 2018, which is hereby incorporated by reference for all purposes as if fully set forth herein.

BACKGROUND

Field

Exemplary implementations of the invention relate generally to display panels and, more particular, to display panels and methods of fabricating same having signal lines that produce more robust display panels with faster signal transmission speeds.

Discussion of the Background

A display device includes a driving circuit (e.g., a gate driving circuit and a data driving circuit) for controlling a plurality of signal lines, a plurality of pixels, and a plurality of pixels. Each of the pixels includes a display element and a pixel driving circuit controlling the display element. The pixel driving circuit includes a plurality of thin film transistors, which are systematically coupled to each other.

The recent trend in display device is to increase resolution and/or eliminate the bezel surrounding the display, which reduces the space available for the various signal lines in the display, which can result in increased failures and/or reduced speed.

The above information disclosed in this Background section is only for understanding of the background of the inventive concepts, and, therefore, it may contain information that does not constitute prior art.

SUMMARY

Display panels constructed according to exemplary implementations of the invention have improved signal transmission speed. Also, methods of fabricating display panels according to exemplary implementations of the invention provide reduced failure ratios.

Additional features of the inventive concepts will be set forth in the description which follows, and in part will be apparent from the description, or may be learned by practice of the inventive concepts.

According to one or more exemplary embodiments of the invention, a display panel includes: a base layer; a signal line disposed on the base layer, the signal line including: a first layer including aluminum; and a second layer directly disposed on the first layer, the second layer including a niobium-titanium alloy; a first thin film transistor connected to the signal line; a second thin film transistor disposed on the base layer; a capacitor electrically connected to the second thin film transistor; and a light emitting element electrically connected to the second thin film transistor.

The first thin film transistor may include a first poly silicon pattern, a first control electrode, a first input electrode, and a first output electrode. The first poly silicon pattern may be disposed on the base layer. The first control electrode may be overlapped with the first poly silicon pattern and may be connected to the signal line. Each of the first input electrode and the first output electrode may be connected to the first poly silicon pattern.

The first control electrode may have substantially the same stacking structure as the signal line.

The second thin film transistor may include a second poly silicon pattern, a second control electrode, a second input electrode, and a second output electrode. The second poly silicon pattern may be disposed on the base layer. The second control electrode may be overlapping the second poly silicon pattern and may be disposed on a layer different from that under the first control electrode. Each of the second input electrode and the second output electrode may be connected to the second poly silicon pattern.

The capacitor may include a first electrode disposed on substantially the same layer as that under the signal line, and a second electrode disposed on substantially the same layer as that under the second control electrode. The first electrode may have substantially the same stacking structure as the signal line.

The second control electrode and the second electrode may include a first layer including an aluminum-nickel-lanthanum alloy, and a second layer directly disposed on the first layer and including a niobium-titanium alloy.

The first layer may further contain nickel and lanthanum. The content of the nickel relative to the first layer may range from 0.01 at % to 0.05 at %, and the content of the lanthanum relative to the first layer may range from 0.02 at % to 0.05 at %.

The content of the titanium relative to the second layer may range from 5 at % to 50 at %, and a content of the niobium relative to the second layer may range from 50 at % to 95 at %.

The signal line may have a line width of that ranges from 3 μm to 5 μm.

The thickness of the first layer may range from 1000 Å to 3000 Å, and a thickness of the second layer may range from 300 Å to 1000 Å.

The display panel may further include a third layer disposed on the second layer, the third layer may include titanium.

The first layer may have a thickness that ranges 1000 Å to 3000 Å, the second layer may have a thickness that ranges 200 Å to 400 Å, and the third layer may have a thickness that range 300 Å to 800 Å.

The signal line may include at least one of a data line, gate line, control signal line, power line and connecting line.

According to one or more exemplary embodiments of the invention, a display panel includes: a base layer; a first thin film transistor disposed on the base layer; a second thin film transistor electrically connected to the first thin film transistor; and a light emitting element connected to the second thin film transistor, wherein the first thin film transistor includes: a first poly silicon pattern disposed on the base layer; a first control electrode overlapping the first poly silicon pattern, the first control electrode including: a first layer including an aluminum-nickel-lanthanum alloy; and a second layer directly disposed on the first layer, the second layer including a niobium-titanium alloy; and a first input electrode and a first output electrode, each of which is connected to the first poly silicon pattern.

The first thin film transistor may further include a third layer directly disposed on the second layer, the third layer containing titanium.

According to one or more exemplary embodiments of the invention, a method of fabricating a display panel includes the steps of: forming a semiconductor pattern on a base layer; forming a signal line on the base layer by forming a first layer containing aluminum, directly forming a second layer on the first layer, the second layer containing a niobium-titanium alloy, and patterning the first layer and the second layer; forming a control electrode on the base layer, the control electrode being overlapped with the semiconductor pattern; forming an input electrode and an output electrode on the base layer, each of the input and output electrode being connected to the semiconductor pattern; and forming a light emitting element on the base layer.

The step of forming of the signal line may further include forming a third layer on the second layer and patterning the third layer. The third layer may contain titanium. The first layer, the second layer, and the third layer are patterned substantially simultaneously through a single etching process.

The first layer may further contain nickel and lanthanum, the content of the nickel relative to the first layer may range from 0.01 at % to 0.05 at %, and the content of the lanthanum relative to the first layer may range from 0.02 at % to 0.05 at %.

The content of the titanium relative to the second layer may range from 5 at % to 50 at %, and the content of the niobium relative to the second layer may range from 50 at % to 95 at %.

The step of forming of the semiconductor pattern may include forming a poly silicon pattern, and doping a region of the poly silicon pattern not overlapped with the control electrode with impurities, and the method of fabricating the display panel may further include annealing the poly silicon pattern at a temperature ranging from 400° C. to 500° C. after forming the signal line.

The method may further include the step of: forming an insulating layer on the base layer to cover the poly silicon pattern, forming a through hole in the insulating layer to expose the region of the poly silicon pattern not overlapped with the control electrode, and cleaning the region of the poly silicon pattern exposed through the through hole.

The step of forming a signal line on the base layer may include: forming at least one of a data line, gate line, control signal line, power line and connecting line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 6B is a diagram showing a difference in enlarged shapes of signal lines in a post cleaning state, caused by a difference in a niobium-titanium content, according to an exemplary embodiment of the invention.

Figure 1:
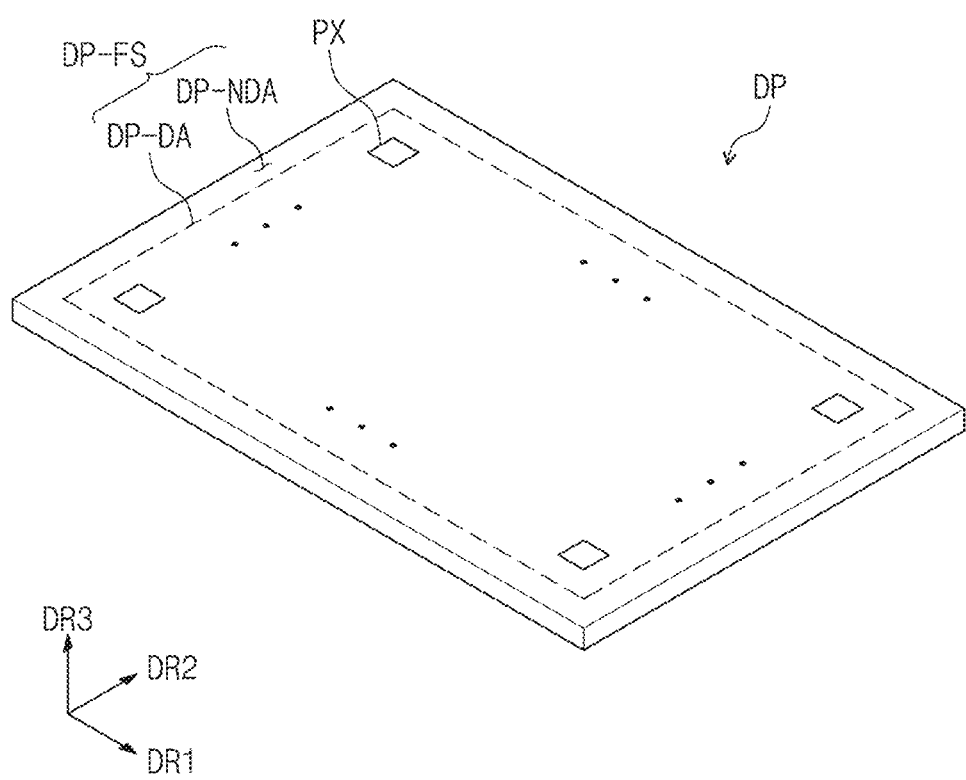
FIG. 1 is a perspective view illustrating an exemplary embodiment of a display panel constructed according to the principles of the invention.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, a DR1-axis, a DR2-axis, and a DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
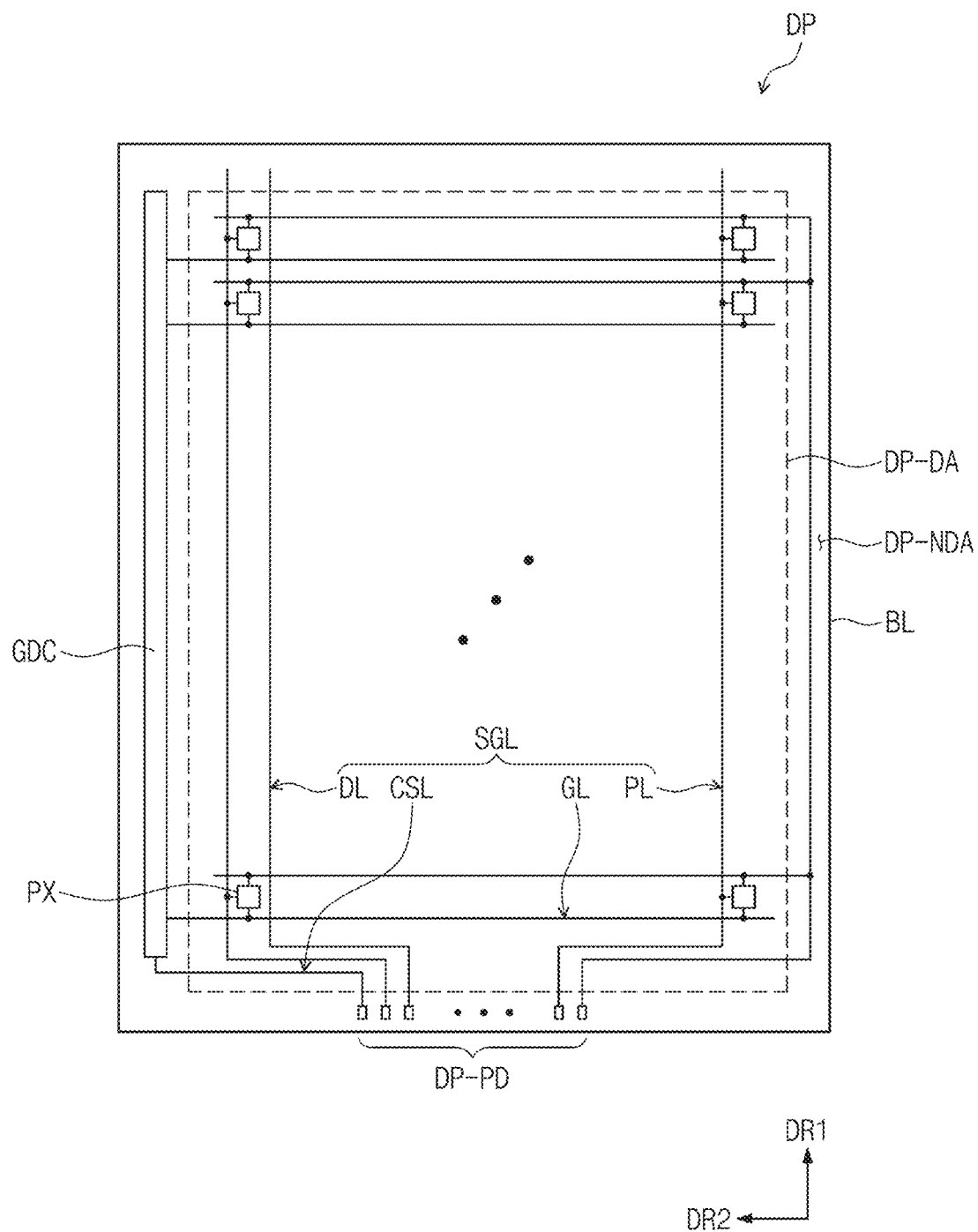
FIG. 2 is a plan view of the display panel of FIG. 1.

FIG. 1 is a perspective view illustrating an exemplary embodiment of a display panel DP constructed according to the principles of the invention. FIG. 2 is a plan view of the display panel DP of FIG. 1. FIG. 2 schematically illustrates an interconnection structure between pixels PX, a driving circuit GDC, and a signal line SGL of a display panel.

The display panel DP may have a front surface DP-FS that is parallel to a first direction axis DR1 and a second direction axis DR2. A normal direction of the front surface DP-FS of the display panel DP (i.e., a thickness direction of the display panel DP) may be referred to as a third direction axis DR3. In each of layers constituting the display panel DP, a top or front surface may be differentiated from a bottom or rear surface, based on the third direction axis DR3. Hereinafter, first to third directions may be directions indicated by the first to third direction axes DR1, DR2, and DR3, respectively, and will be identified with the same reference numbers.

As shown in FIG. 1, the display panel DP or the front surface DP-FS thereof may include a display region DP-DA, on which the pixels PX to be seen by a user are disposed, and a non-display region DP-NDA, which is provided adjacent to the display region DP-DA. The non-display region DP-NDA may be a region, in which the pixels PX are not disposed. Some of the signal lines SGL and/or the driving circuit GDC may be provided in the non-display region DP-NDA.

As shown in FIG. 1, the display region DP-DA may be generally rectangular or tetragonal. The non-display region DP-NDA may surround the display region DP-DA. However, the exemplary embodiments are not limited thereto, and the shapes of the display region DP-DA and the non-display region DP-NDA may be variously changed in a complementary manner. For example, the non-display region DP-NDA may be provided in only two regions of the front surface DP-FS, which are opposite to each other in the first direction DR1. In an exemplary embodiment, the display region DP-DA may be circular.

As shown in FIG. 2, the display panel DP may include a driving circuit GDC, a plurality of signal lines SGL, a plurality of signal pads DP-PD, and a plurality of pixels PX.

The pixels PX may be classified into a plurality of groups, according to display colors of the pixels. For example, the pixels PX may include red pixels, green pixels, and blue pixels. In an exemplary embodiment, the pixels PX may further include white pixels. Even when some of the pixels are included in different groups, the pixel driving circuits of the pixels may be the same.

The driving circuit GDC may include a gate driving circuit. The gate driving circuit may generate a plurality of gate signals and sequentially output the gate signals to a plurality of gate lines GL, which will be described below. In addition, the gate driving circuit may be configured to output other control signals to a driving circuit of the pixel PX.

The gate driving circuit may include a plurality of thin-film transistors, which are formed by the same method as that for the driving circuit of the pixels PX or by, for example, a low-temperature polycrystalline silicon (LTPS) or low-temperature polycrystalline oxide (LTPO) process.

The signal lines SGL may include any line capable of carrying electronic signals in the display, including the gate lines GL, data lines DL, a power line PL, and a control signal line CSL. Each of the gate lines GL may be connected to corresponding ones of the pixels PX, and each of the data lines DL may be connected to corresponding ones of the pixels PX. The power line PL may be connected to the pixels PX. The control signal line CSL may be used to provide control signals to the gate driving circuit. The signal pads DP-PD may be connected to corresponding ones of the signal lines SGL. The signal lines SGL may further include light emission signal lines.

In the illustrated exemplary embodiment, each of the pixels PX may be a light-emitting type pixel. For example, the pixel PX may include an organic light emitting diode or a quantum-dot light-emitting diode, which is used as a luminescent device. A luminescent layer of the organic light emitting diode may include an organic luminescent material. A luminescent layer of the quantum-dot light-emitting diode may include quantum dots and quantum rods. For the sake of simplicity, the description that follows will refer to an example in which an organic light emitting pixel is used as the pixel PX.

The pixel PX may include an organic light emitting diode and a pixel driving circuit for driving the organic light emitting diode. The organic light emitting diode may be a top-emission type diode or a bottom-emission type diode. The pixel driving circuit may include at least a switching thin film transistor, a driving thin film transistor, and a capacitor. A high power voltage may be provided to the driving thin film transistor, and a low power voltage may be provided to one of electrodes of the organic light emitting diode. The driving thin film transistor may control a driving current passing through the organic light emitting diode, depending on an amount of charges stored in the capacitor. The switching thin film transistor may output a data signal applied to a data line, in response to a gate signal applied to the gate line. The capacitor may be charged to a voltage level corresponding to the data signal received from the switching thin film transistor.

In an exemplary embodiment, the pixel driving circuit may be configured to have six or seven thin film transistors including the switching thin film transistor and the driving thin film transistor. However, the exemplary embodiments are not limited thereto, and in any given exemplary embodiment, the structure of the pixel driving circuit may be variously changed. Furthermore, the design of the signal lines SGL may also be changed depending on the structure of the pixel driving circuit.

Figure 3:
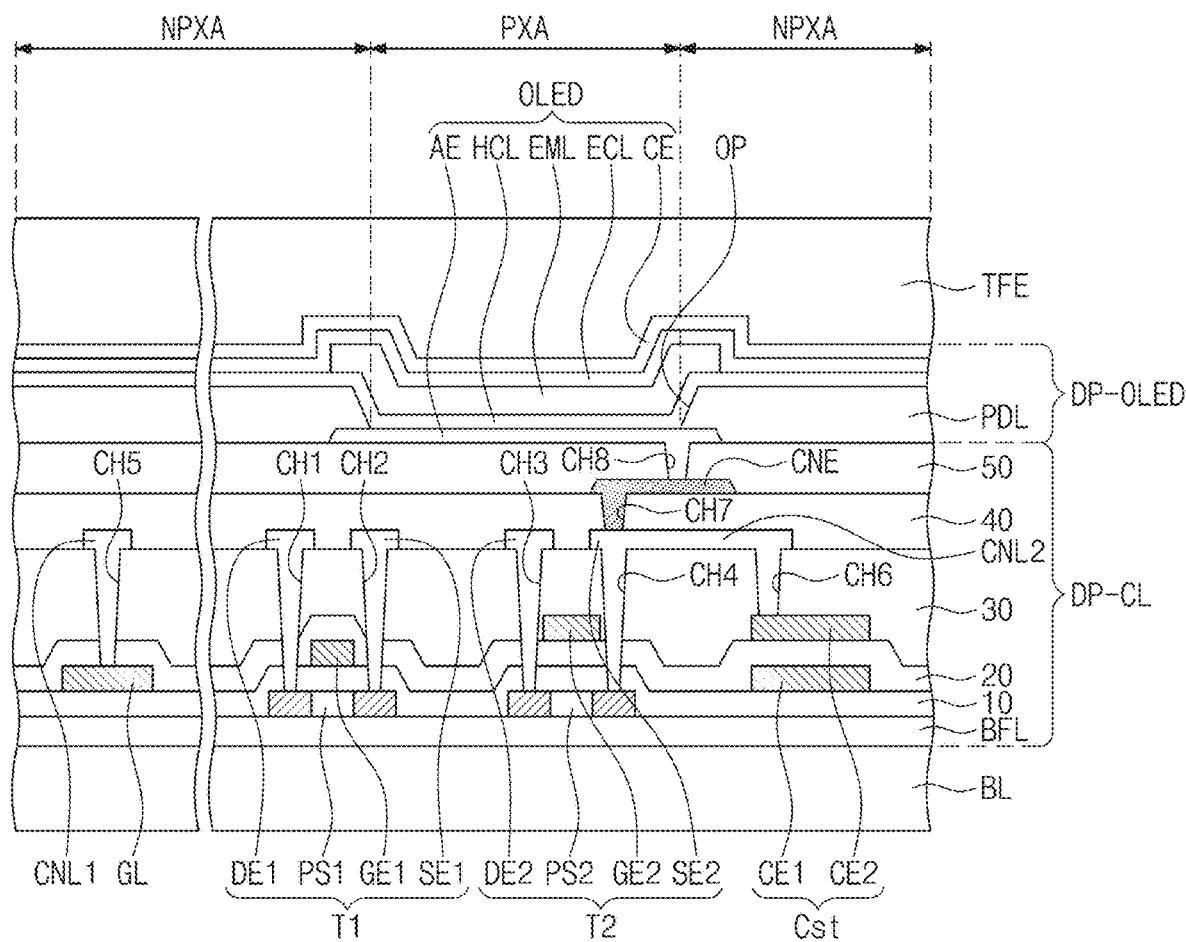
FIG. 3 is a sectional view illustrating an exemplary embodiment of a portion of a pixel of FIG. 1 constructed according to the principles of the invention.

FIG. 3 is a sectional view illustrating an exemplary embodiment of a portion of the pixel PX of FIG. 1 constructed according to the principles of the invention. FIG. 3 illustrates a vertical section of a portion of the pixel PX, in which a switching thin film transistor T1 (hereinafter, a first thin film transistor), a driving thin film transistor T2 (hereinafter, a second thin film transistor), a capacitor Cst, and an organic light emitting diode OLED are disposed. In addition, a vertical section of a portion including the gate line GL is further illustrated in FIG. 3.

As shown in FIG. 3, the display panel DP may include a base layer BL and some elements (e.g., a circuit device layer DP-CL, a display device layer DP-OLED, and a thin encapsulation layer TFE) disposed on the base layer BL. In an exemplary embodiment, the thin encapsulation layer TFE may be replaced with an encapsulation substrate (e.g., a metal substrate or a glass substrate). The display panel DP may further include functional layers, such as an anti-reflection layer and a refractive index adjusting layer. The circuit device layer DP-CL may include at least a plurality of insulating layers and a circuit device. In an exemplary embodiment, the insulating layers may include organic layers and/or inorganic layers, as will be described below.

The circuit device may include signal lines, pixel driving circuits, and so forth. The circuit device layer may be formed by forming an insulating layer, a semiconductor layer, and a conductive layer using a coating or depositing process and then patterning the insulating layer, the semiconductor layer, and the conductive layer using a photolithography process. The display device layer DP-OLED may include a light-emitting element. The display device layer DP-OLED may further include an organic layer, which is formed of the same material as the pixel definition layer PDL.

The base layer BL may be formed of or include a synthetic resin film. The synthetic resin layer may include a thermosetting resin. The synthetic resin layer may be a polyimide-based resin layer, but the exemplary embodiments are not limited to a specific material. The synthetic resin layer may include at least one of acryl resins, methacrylate resins, polyisoprene resins, vinyl resins, epoxy resins, urethane resins, cellulose resins, siloxane resins, polyamide resins, or perylene resins. In an exemplary embodiment, the base layer BL may include a glass substrate, a metal substrate, or an organic/inorganic composite substrate.

At least one inorganic layer may be formed on a top surface of the base layer BL. The inorganic layer may include at least one of aluminum oxide, titanium oxide, silicon oxide silicon oxynitride, zirconium oxide, or hafnium oxide. For example, the at least one inorganic layer may include a plurality of inorganic layers of a multi-layered structure. The multi-layered inorganic layers may constitute a buffer layer BFL to be described below. The buffer layer BFL may prevent or limit an extraneous material from entering the display panel DP. In addition, the buffer layer BFL may improve an adhesion property of conductive or semiconductor patterns, compared to the case of directly forming the conductive or semiconductor patterns on the base layer BL.

A first semiconductor pattern PS1 and a second semiconductor pattern PS2 may be disposed on the buffer layer BFL. Each of the first semiconductor pattern PS1 and the second semiconductor pattern PS2 may be formed of or include polycrystalline silicon. However, the exemplary embodiments are not limited thereto, and in an exemplary embodiment, each of the first semiconductor pattern PS1 and the second semiconductor pattern PS2 may be formed of or include at least one of various semiconductor materials (e.g., silicon or oxide semiconductor materials) and may have one of polycrystalline or amorphous structures.

Each of the first semiconductor pattern PS1 and the second semiconductor pattern PS2 may include an input region (or a first portion), an output region (or a second portion), and a channel region (or a third portion) between the input region and the output region. The channel region of the first semiconductor pattern PS1 may be defined to face a first control electrode GE1 to be described below, and the channel region of the second semiconductor pattern PS2 may be defined to face a second control electrode GE2 to be described below. The input region and the output region may be doped with impurities and may have conductivity higher than that of the channel region. For example, the input region and the output region may be doped to have an n-type conductivity. The description that follows will refer to an example, in which the first semiconductor pattern PS1 and the second semiconductor pattern PS2 are of n-type, but the first semiconductor pattern PS1 and the second semiconductor pattern PS2 may be a p-type. Alternatively, one of the first semiconductor pattern PS1 and the second semiconductor pattern PS2 may be a p-type and the other may be an n-type.

A first insulating layer 10 may be disposed on the buffer layer BFL. The first insulating layer 10 may be commonly overlapped with a plurality of the pixels PX (e.g., see FIGS. 1 and 2) and may cover the first semiconductor pattern PS1 and the second semiconductor pattern PS2. The first insulating layer 10 may be an inorganic layer and/or an organic layer and may have a single- or multi-layered structure.

The first control electrode GE1 may be disposed on the first insulating layer 10. The first control electrode GE1 may be overlapped with the channel region of the first semiconductor pattern PS1. The gate line GL and a first electrode CE1 of the capacitor Cst may be disposed on the first insulating layer 10. The first control electrode GE1, the gate line GL, and the first electrode CE1 may be formed by the same process and may have therefore the same stacking structure. Although not shown in FIG. 3, the first control electrode GE1 may be connected to the gate line GL, when viewed in a plan view. The gate line GL may be used to provide a turn-on signal to the first thin film transistor T1.

A second insulating layer 20 may be disposed on the first insulating layer 10 to cover the first control electrode GE1, the gate line GL, and the first electrode CE1. The second insulating layer 20 may be commonly overlapped with the plurality of the pixels PX. The second insulating layer 20 may be an inorganic and/or organic layer and may have a single- or multi-layered structure.

The second control electrode GE2 may be disposed on the second insulating layer 20. The second control electrode GE2 may be overlapped with the channel region of the second semiconductor pattern PS2. A second electrode CE2 of the capacitor Cst may be disposed on the second insulating layer 20. The second control electrode GE2 and the second electrode CE2 may be formed by the same process and may have the same stacking structure. In an exemplary embodiment, the second control electrode GE2 may be disposed at the same level or on the same layer as the first control electrode GE1.

A third insulating layer 30 may be disposed on the second insulating layer 20 to cover the second control electrode GE2 and the second electrode CE2. The third insulating layer 30 may be an inorganic and/or organic layer and may have a single- or multi-layered structure. The first to third insulating layers 10, 20, and 30 may include at least one of aluminum oxide, titanium oxide, silicon oxide silicon oxynitride, zirconium oxide, or hafnium oxide. In the illustrated exemplary embodiment, the third insulating layer 30 may be a single-layered silicon oxide layer.

Connection signal lines and input/output electrodes may be disposed on the third insulating layer 30. A first input electrode DE1 and a first output electrode SE1 may be disposed on the third insulating layer 30 and may be connected to the input and output regions, respectively, of the first semiconductor pattern PS1 through a first through hole CH1 and a second through hole CH2. A second input electrode DE2 and a second output electrode SE2 may be disposed on the third insulating layer 30 and may be connected to the input and output regions, respectively, of the second semiconductor pattern PS2 through a third through hole CH3 and a fourth through hole CH4. The first to fourth through holes CH1, CH2, CH3, and CH4 may penetrate the first to third insulating layers 10, 20, and 30.

A first connection signal line CNL1 and a second connection signal line CNL2 may be disposed on the third insulating layer 30. The first connection signal line CNL1 may be connected to the gate line GL through a fifth through hole CH5, and the second connection signal line CNL2 may be connected to the second electrode CE2 through a sixth through hole CH6. The first connection signal line CNL1 may be connected to another thin film transistor of the pixel driving circuit.

A fourth insulating layer 40 may be disposed on the third insulating layer 30 to cover the connection signal lines and the input/output electrodes. There may be no limitation in a material of the fourth insulating layer 40. A connection electrode CNE may be disposed on the fourth insulating layer 40. The connection electrode CNE may be directly or indirectly connected to the second output electrode SE2 through a seventh contact hole CH7 penetrating the fourth insulating layer 40 or may be electrically connected to the second output electrode SE2 through another connection signal line. A fifth insulating layer 50 (or a passivation layer) may be disposed on the fourth insulating layer 40 to cover the connection electrode CNE. The fifth insulating layer 50 may be an organic layer and may have a single- or multi-layered structure.

In the illustrated exemplary embodiment, at least one of the fourth insulating layer 40 and the fifth insulating layer 50 may be a single-layered polyimide resin layer. However, the exemplary embodiments are not limited thereto, and in an exemplary embodiment, the fourth insulating layer 40 and the fifth insulating layer 50 may include at least one of acryl resins, methacrylate resins, polyisoprene resins, vinyl resins, epoxy resins, urethane resins, cellulose resins, siloxane resins, polyamide resins, or perylene resins.

The organic light emitting diode OLED may be disposed on the fifth insulating layer 50. An anode AE of the organic light emitting diode OLED may be disposed on the fifth insulating layer 50. The anode AE may be connected to the connection electrode CNE through an eighth contact hole CH8 penetrating the fifth insulating layer 50. The pixel definition layer PDL may be disposed on the fifth insulating layer 50.

The pixel definition layer PDL may have an opening OP that is formed to expose at least a portion of the anode AE. The opening OP of the pixel definition layer PDL may define a light-emitting region PXA of the pixel. For example, a plurality of the pixels PX (e.g., see FIG. 1) may be regularly disposed in the display panel DP, when viewed in a plan view. A region with the pixels PX may be defined as a pixel region, and each pixel region may include the light-emitting region PXA and a non-light-emitting region NPXA adjacent to the light-emitting region PXA. The non-light-emitting region NPXA may enclose the light-emitting region PXA.

A hole control layer HCL may be commonly disposed in the light-emitting region PXA and the non-light-emitting region NPXA. The common layer, such as the hole control layer HCL, may be commonly provided in a plurality of the pixels PX (e.g., see FIGS. 1 and 2). The hole control layer HCL may include a hole transport layer and a hole injection layer.

An organic light emitting layer EML may be disposed on the hole control layer HCL. The organic light emitting layer EML may be locally disposed on only a region corresponding to the opening OP. That is, the organic light emitting layers EML may be respectively disposed in the pixels PX and may have respective boundaries spaced apart from each other.

In the illustrated exemplary embodiment, the organic light emitting layer EML is illustrated to have a patterned structure, but in an exemplary embodiment, the organic light emitting layer EML may be commonly disposed in a plurality of the pixels PX. Here, the organic light emitting layer EML may be configured to emit a white light or a blue light. Furthermore, the organic light emitting layer EML may have a multi-layered structure.

An electron control layer ECL may be disposed on the organic light emitting layer EML. The electron control layer ECL may include an electron transport layer and an electron injection layer. A cathode CE may be disposed on the electron control layer ECL. The electron control layer ECL and the cathode CE may be commonly disposed in a plurality of the pixels PX.

The thin encapsulation layer TFE may be disposed on the cathode CE. The thin encapsulation layer TFE may be disposed to commonly cover a plurality of the pixels PX. In the illustrated exemplary embodiment, the thin encapsulation layer TFE may directly cover the cathode CE. In an exemplary embodiment, a capping layer may be further disposed to cover the cathode CE. In an exemplary embodiment, a stacking structure of the organic light emitting diode OLED may have a shape obtained by capsizing that illustrated in FIG. 3.

The thin encapsulation layer TFE may include at least an inorganic layer or an organic layer. In an exemplary embodiment, the thin encapsulation layer TFE may include two inorganic layers and an organic layer therebetween. In an exemplary embodiment, the thin encapsulation layer TFE may include a plurality of inorganic layers and a plurality of organic layers, which are alternately stacked.

The inorganic encapsulation layer may protect the organic light emitting diode OLED from moisture or oxygen, and the organic encapsulation layer may protect the organic light emitting diode OLED from foreign substances (e.g., dust particles). The inorganic encapsulation layer may include a silicon nitride layer, a silicon oxynitride layer, a silicon oxide layer, a titanium oxide layer, or an aluminum oxide layer, but the exemplary embodiments are not limited thereto. The organic encapsulation layer may include an acrylic organic layer, but the exemplary embodiments are not limited thereto.

Unlike that shown in FIG. 3, the fourth insulating layer 40 and the connection electrode CNE may be omitted. The fifth insulating layer 50 may cover the second output electrode SE2, and the anode AE may be directly or indirectly connected to the second output electrode SE2. According to an equivalent circuit of the present exemplary embodiment, the second thin film transistor T2 may be directly connected to the organic light emitting diode OLED. However, the exemplary embodiments are not limited thereto. In an exemplary embodiment, when viewed in an equivalent circuit, another thin film transistor may be further disposed between the second thin film transistor T2 and the organic light emitting diode OLED.

Figure 4:
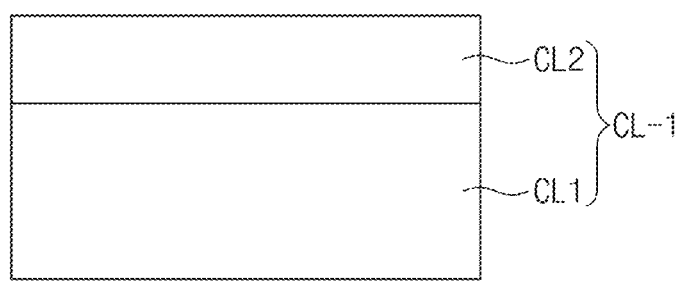
FIG. 4 is a sectional view schematically illustrating an exemplary embodiment of a signal line constructed according to the principles of the invention.

FIG. 4 is a sectional view schematically illustrating an exemplary embodiment of a signal line CL-1 according to the principles of the invention.

The signal line CL-1 according to the illustrated exemplary embodiment, which will be described with reference to FIG. 4, may be used as the gate line GL of FIG. 3. The signal line CL-1 may have a double-layered stacking structure. The signal line CL-1 may include a first layer CL1, in which aluminum is contained, and a second layer CL2, which is directly disposed on or is in direct contact with the first layer CL1 and contains a niobium-titanium alloy. In an exemplary embodiment, second layer may be made of a niobium-titanium alloy.

Since the first layer CL1 contains aluminum, the signal line CL-1 may have a reduced resistance, compared with a conventional molybdenum-based signal line. The electrical resistance of a metal line may be reduced by increasing the thickness or line width of the metal line. However, in the case where the signal line has a thickness larger than a critical thickness, the base layer BL (e.g., see FIG. 3) may be damaged (e.g., bent or broken) due to a tensile stress. In the case where the line width is increased, an additional area may be required to maintain a required distance between signal lines or to dispose the widened signal lines. That is, an area of the non-display region DP-NDA may be increased.

In the case where the signal line CL-1 is formed of or includes aluminum, it may be possible to reduce a thickness and a line width of the signal line CL-1. According to exemplary embodiments, damage to the base layer BL may be prevented or reduced and an area of the non-display region DP-NDA may be reduced. Accordingly, the display panel constructed according to the exemplary embodiments may realize a bezel-less-design or minimize the non-display area.

According to a display panel having a high resolution, the signal line CL-1 may have a line width of 3 μm or less due to the distance between the pixels being small. Accordingly, a short failure may occur in the pixel driving circuit due to the narrow line width. On the other hand, if the line width is larger than 5 μm, it is difficult to realize a bezel-less design. In an exemplary embodiment, the signal line CL-1 of the double-layered stacking structure may be formed to have a line width ranging from about 3 μm to about 5 μm, and thus, the above issues may not occur.

The first layer CL1 may be formed of or include an aluminum-nickel-lanthanum alloy. In this case, it may be possible to prevent or suppress a hillock formation phenomenon from occurring in the signal line CL-1. In detail, at a high temperature of about 400° C., a hillock formation phenomenon may occur in an aluminum layer. For example, the aluminum line may be thermally expanded by a thermal stress at a high temperature and may have a protruding or cracked portion. Thus, if aluminum is used for the signal line CL-1, electrical or physical characteristics of the signal line CL-1 may be deteriorated by thermal environment in a subsequent process. However, according to an exemplary embodiment of the invention, the aluminum-nickel-lanthanum alloy is used for the signal line CL-1, the signal line CL-1 may have an improved heat-resistant property and a hillock formation issue may be prevented or reduced.

The content of aluminum relative to the first layer CL1 may range from about 99.90 at % to about 99.99 at %. The content of nickel relative to the first layer CL1 may range from about 0.01 at % to about 0.05 at %, and the content of lanthanum relative to the first layer CL1 may range from about 0.02 at % to about 0.05 at %. The composition of the aluminum alloy may be found using ICP, XPS, and SIMS methods. As used herein, at % means atom %.

In the case where the contents of nickel and lanthanum are less than the above mentioned range of at %, it may be difficult to realize a good heat-resistant property, and thus, the hillock formation issue may arise. And, if the contents of nickel and lanthanum are higher than the above mentioned range of at %, it may be difficult to reduce resistance of the signal line CL-1 and to prevent or reduce a process failure from occurring in a dry etching process.

The thickness of the first layer CL1 may range from about 1000 Å to about 3000 Å. If the thickness of the first layer CL1 is less than 1000 Å, the first layer CL1 may have a high resistance. If the thickness of the first layer CL1 is larger than 3000 Å, the fabrication cost may be increased, and moreover, it may take a long time to perform an etching process. In addition, a process failure may occur in a patterning process. However, the exemplary embodiments are not limited to the above thickness range of the first layer CL1, and the thickness of the first layer CL1 may be changed within a range, which can be predicted by a skilled person in the art, based on a size of the display panel DP and/or a composition ration of materials of the first layer CL1.

Since the second layer CL2 is directly disposed on the first layer CL1, it may be possible to more effectively prevent or reduce the hillock formation issue from occurring in the signal line. This is because, owing to the second layer CL2 covering a top surface of the first layer CL1, there is no room allowing the first layer CL1 to be expanded.

Hereinafter, differences between comparative examples including the second layer CL2 being made of titanium or titanium nitride and the second layer CL2 being made of niobium-titanium alloy are described in the illustrated exemplary embodiment.

In the case where the second layer CL2 is made of only titanium, a diffusion of aluminum and titanium occurs at the interface between the first layer CL1 and the second layer CL2 when a thermal treatment process is performed on the first semiconductor pattern PS1 and the second semiconductor pattern PS2 at a temperature ranging from about 400° C. to about 500° C. Thus, an alloy of aluminum and titanium is formed, and the resistance of the signal line CL-1 is sharply increased.

In the case where titanium nitride is used as the second layer CL2, contamination materials such as particles may be introduced into an interface between the first layer CL1 and the second layer CL2 during the deposition process of the second layer CL2 due to a low film growth rate. Thus, a property of the signal line CL-1 may be deteriorated.

On the other hand, according to the illustrated exemplary embodiment, the niobium-titanium alloy is used as the second layer CL2. Accordingly, no or limited diffusion occurs between materials constituting the first layer CL1 and the second layer CL2, and therefore, the signal line may have a low resistance. Thus, the signal line may be formed to have a small thickness and a small line width. In addition, in the case where the niobium-titanium alloy is used as the second layer CL2, the second layer CL2 may be grown with a large film growth rate. Thus, it may be possible to prevent or suppress the contamination materials from entering the interface between the first layer CL1 and the second layer CL2 and to prevent or reduce deterioration of physical or electric characteristics of the signal line CL-1.

The thickness of the second layer CL2 may range from 300 Å to 1000 Å. In the case where the thickness of the second layer CL2 is less than 300 Å, all of the second layer CL2 may be etched during the cleaning process, as will be described below, and in this case, the first layer CL1 may be in contact with or react with the cleaning solution. That is, the first layer CL1 may be damaged, and the second layer CL2 may not play a role as a capping layer. In the case where the thickness of the second layer CL2 is larger than 1000 Å, a fabrication cost may be increased, and moreover, it may take a long time to perform an etching process. In addition, a process failure may occur in a patterning process. The thickness of each of the layer may be measured using Transmission Electron Microscopy (TEM) or using Focused Ion Beam (FIB).

Figure 5:
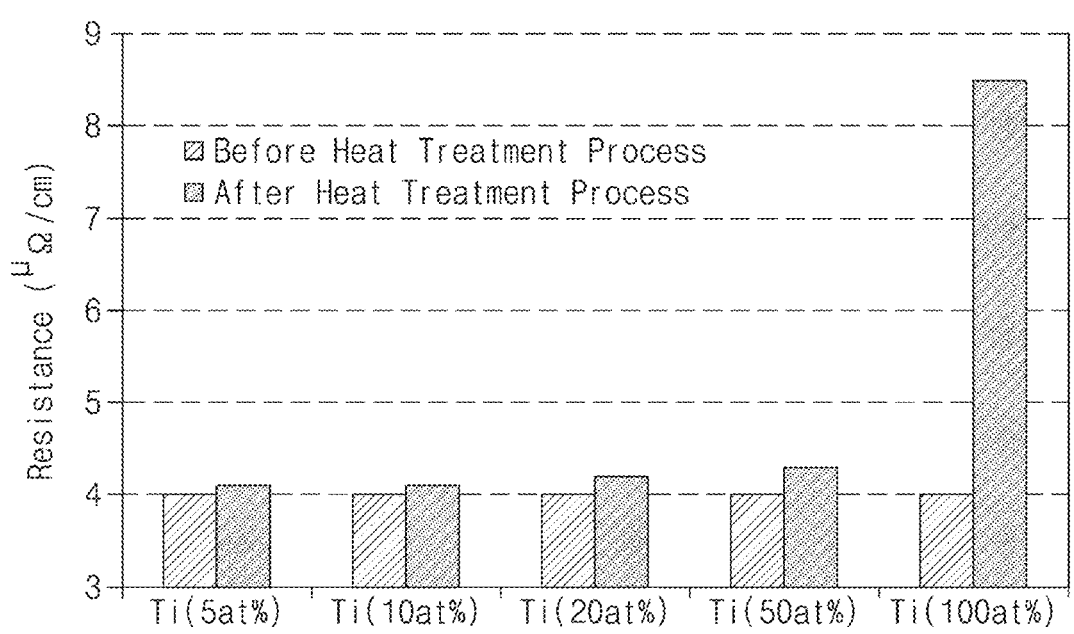
FIG. 5 is a graph showing the change in resistance of a signal line caused by a thermal treatment process according to an exemplary embodiment of the invention.

FIG. 5 is a graph showing the change in resistance of a signal line caused by a thermal treatment process according to an exemplary embodiment of the invention. FIG. 5 shows resistance values of the signal line CL-1 measured before and after a thermal treatment process, according to a niobium-titanium ratio of the second layer CL2. The second layers CL2 having five different niobium-titanium ratios (at %) of about 95:5, 90:10, 80:20, 50:50, and 0:100 were used in the experiment.

As shown in FIG. 5, when the thermal treatment process was not performed on the signal lines CL-1, the signal lines CL-1 had a substantially invariant resistance value of about 4 μΩ/cm, regardless of the difference in niobium-titanium ratio. After the thermal treatment process, signal lines CL-2 had slightly increasing resistance values with increasing titanium ratio and was controlled to an acceptable value of about 4μΩ/cm or higher until the titanium ratio reached about 50 at %. However, when the titanium ratio was about 100 at %, the resistance was increased to a high value of about 8μΩ/cm or higher.

According to the experiment results shown in FIG. 5, the second layer CL2 may be provided to have a titanium ratio ranging from about 5 at % to about 50 at %. FIG. 5 shows that when the titanium content is less than about 50 at %, it is possible to effectively prevent or limit the diffusion between aluminum and titanium during the thermal treatment process. When the titanium content is higher than about 50 at %, a resistance value may be increased due to formation of an alloy of aluminum and titanium from diffusion therebetween.

According to an exemplary embodiment of the invention, the niobium content may be less than about 95 at %. For example, the niobium content may range from about 50 at % to about 95 at %.

In the case where the niobium content is increased, niobium penthoxide ($Nb_2O_5$) may be formed by a chemical reaction between niobium and oxygen, during the thermal treatment process. If the niobium oxide is formed, the resistance value of the signal line CL-1 may be increased. Therefore, strict process control may be required to limit oxygen in the thermal treatment process.

As shown in FIG. 5, in the case where the niobium content is less than about 95 at %, the thermal treatment process did not lead to a large variation in resistance value of the signal line, and this result represents that the niobium is not oxidized. Thus, according to an exemplary embodiment of the invention, strict process control to limit oxygen during the thermal treatment process may not be necessary. In the case where the niobium content is higher than about 95 at %, the resistance value of the signal line CL-1 may be increased by an oxidation process in the absence of strict process control for limiting oxygen.

The following Table 1 shows results obtained by performing a cleaning process on the second layers CL2 with titanium contents of about 5, 10, 20, and 50 at % using a spraying method. The cleaning process was performed at a room temperature for 1000 seconds (600 seconds for a sample whose Ti content was about 50 at %). A mixture of hydrogen fluoride (HF) and ammonium fluoride ($NH_4F$) (e.g., a buffered oxide etchant solution) was used as a cleaning solution.

TABLE 1

| Nb—Ti content (Ti at %) | Cleaning time (sec) | Etch amount (Å) | Etch rate (Å/sec) |
|---|---|---|---|
| 5 | 1000 | 0 | 0 |
| 10 | 1000 | 80 | 0.08 |
| 20 | 1000 | 300 | 0.3 |
| 50 | 600 | 890 | 1.48 |

Figure 6A:
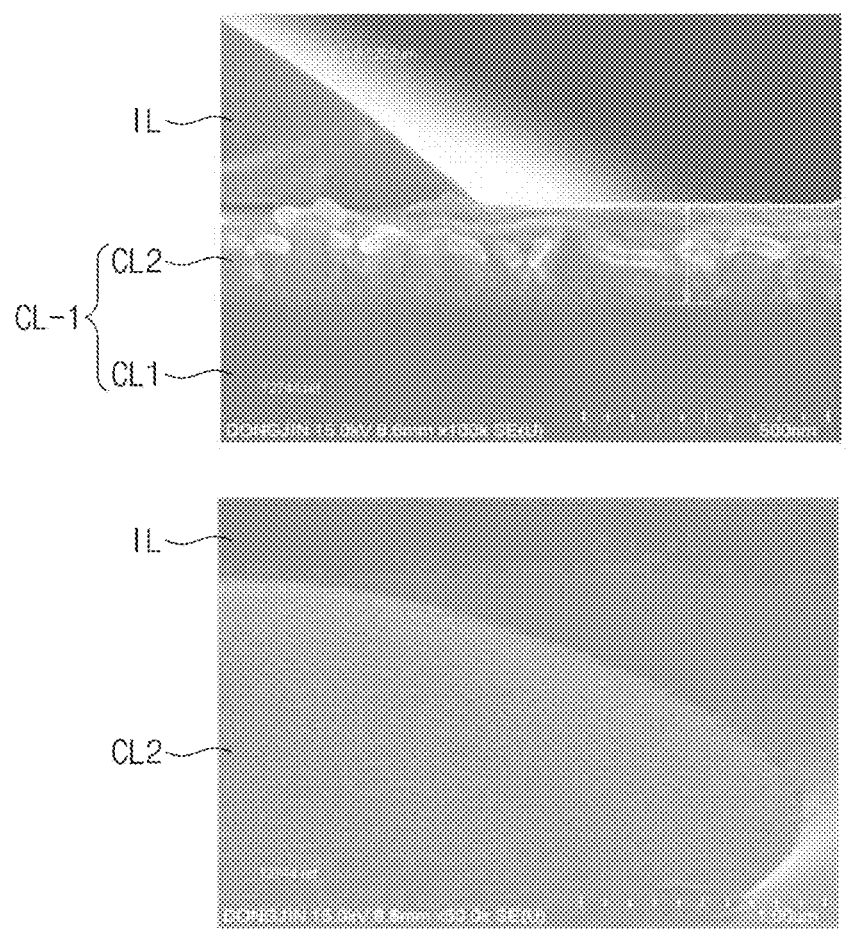
FIG. 6A is a diagram showing SEM images of a signal line obtained before and after a cleaning process according to an exemplary embodiment of the invention.

FIG. 6A is a diagram showing SEM images of the signal line CL-1 obtained before and after a cleaning process according to an exemplary embodiment of the invention. FIG. 6B is a diagram showing a difference in enlarged shapes of the signal lines CL-1, which were obtained after the cleaning process when there was a difference in a niobium-titanium content given in Table 1. The cleaning process was performed through a method of spraying a cleaning solution onto the display panel DP and of dipping the display panel DP in a cleaning solution. A sectional view and a plan view of the signal line CL-1 were illustrated in FIGS. 6A and 6B, respectively. The second layer CL2 and an insulating layer IL sequentially stacked on the first layer CL1 are shown in the sectional view of FIG. 6A. The second layer CL2 and the insulating layer IL are shown in the plan view of FIG. 6B. In an exemplary embodiment, the insulating layer IL may be one of the first to third insulating layers 10, 20, and 30, but the exemplary embodiments are not limited thereto.

Referring to Table 1, the higher the content of titanium in the second layer CL2, the higher the etch rate of the second layer CL2. For example, FIG. 6B shows that an increase of the titanium content results in a fast etching and a reduction in thickness of the second layer CL2. In the case where the titanium content is higher than about 50 at %, due to a high etch rate, all of the second layer CL2 may be removed during the cleaning process, and thus, the cleaning solution may be in contact with and react with the first layer CL1, thereby causing a damage of the first layer CL1. To avoid this issue, it is necessary to increase the thickness of the second layer CL2. However, in an exemplary embodiment, the second layer CL2 may be formed to have a titanium content that is lower than about 50 at %, and thus, the second layer CL2 may be reduced. That is, it may be possible to reduce a thickness of the signal line CL-1 and to prevent or limit the first layer CL1 from the cleaning solution.

So far, an example in which the second layer is made of the niobium-titanium alloy, has been described, but the exemplary embodiments are not limited thereto. For example, the second layer may further include other material (s).

Figure 7:
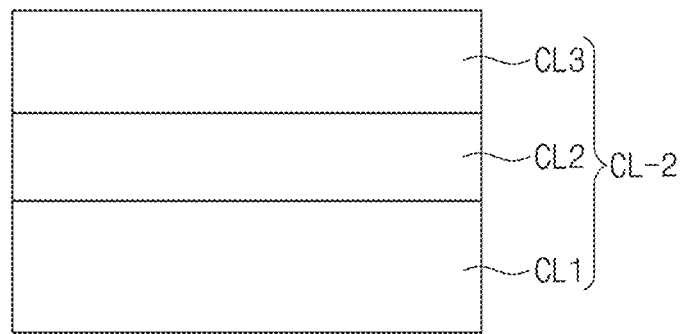
FIG. 7 is a sectional view schematically illustrating a signal line constructed according to an exemplary embodiment of the invention.

FIG. 7 is a sectional view schematically illustrating the signal line CL-2 according to an exemplary embodiment of the invention. The signal line CL-2 may have a triple-layered stacking structure. For example, the signal line CL-2 may include the first layer CL1 containing aluminum, the second layer CL2, which is directly disposed on or in direct contact with the first layer CL1 and contains a niobium-titanium alloy, and a third layer CL3, which is directly disposed on or in direct contact with the second layer CL2 and contains titanium.

Since the third layer CL3 is disposed on the second layer CL2, the second layer CL2 may not be etched unless the third layer CL3 thereon is removed, during the cleaning process. Thus, it may be possible to reduce the second layer CL 2, compared with the signal line CL-1 of the double-layered stacking structure. This may make it possible to reduce a usage amount of expensive niobium and to reduce a process cost.

The thickness of the second layer CL2 may range from about 200 Å to about 400 Å. If the thickness of the second layer CL2 is less than about 200 Å, the second layer CL2 may be formed to have a large thickness variation, which may cause a process failure, and there may be an intermixing issue resulting from diffusion of aluminum atoms of the first layer CL1 and titanium atoms of the third layer CL3. In addition, during the cleaning process, the second layer CL2 may be removed to allow the first layer CL1 to be in contact with or react with the cleaning solution. That is, the first layer CL1 may be damaged, and the second layer CL2 may not play a role as a capping layer. If the second layer CL2 is formed to have a thickness of about 400 Å or thicker, there may be other technical difficulties, such as an increased fabrication cost, a long etching time, and a failure in the patterning process.

The thickness of the third layer CL3 may range from about 300 Å to about 800 Å. If the thickness of the third layer CL3 is less than about 300 Å, the third layer CL3 may be quickly removed during the cleaning process, and in this case, the second layer CL2 may be exposed to the cleaning solution at an early time. Thus, the second layer CL2 may be etched by the cleaning solution to allow the first layer CL1 to be in contact with or react with the cleaning solution. That is, the first layer CL1 may be damaged, and the third layer CL3 may not play a role as a capping layer. If the thickness of the third layer CL3 is larger than about 800 Å, there may be other technical difficulties, such as an increased fabrication cost, a long etching time, and a failure in the patterning process.

Since the third layer CL3 is formed of only titanium, the third layer CL3 may have a high etch rate in the cleaning process. Thus, the sum of thicknesses of the second layer CL2 and the third layer CL3 in the triple-layered stacking structure may be larger than a thickness of the second layer CL2 in the double-layered stacking structure shown in FIG. 4, by about 200 Å. Accordingly, it may be possible to prevent or limit the first layer CL1 from being exposed to the cleaning solution, during the cleaning process.

Except for the above differences, the description of FIG. 4 may be applied to the exemplary embodiment illustrated in FIG. 7. Accordingly, the descriptions of elements of FIG. 7 identified by a similar or identical reference number with the elements of FIG. 4 may omitted and not repeated to avoid redundancy.

In an exemplary embodiment, conductive patterns may be formed by the same process as that for the gate line GL described with reference to FIG. 3, and in this case, the conductive patterns may have the same stacking structure as the signal lines CL-1 and CL-2 shown in FIGS. 4 and 7. For example, the first control electrode GE1 (e.g., see FIG. 3) and the first electrode CE1 may have the same stacking structure (e.g., the double- or triple-layered structure) as the gate line GL.

In an exemplary embodiment, the signal lines CL-1 and CL-2 shown in FIGS. 4 and 7 may be used as connection signal lines for connecting conductive patterns to each other. Although not shown in the sectional views of FIGS. 4 and 7, the connection signal lines may be used as a part of the pixel driving circuit. For example, the connection signal line may connect the thin film transistors to each other.

The connection signal line may be disposed on the second insulating layer 20 and may have the same stacking structure as the signal lines CL-1 and CL-2 shown in FIGS. 4 and 7. In addition, conductive pattern may be formed by the same process as that for relevant connection signal lines, and in this case, the conductive pattern may have the same stacking structure as the signal lines CL-1 and CL-2 shown in FIGS. 4 and 7. The second control electrode GE2 (e.g., see FIG. 3) and the second electrode CE2 may have the same stacking structure as a connection signal line, which is disposed on the second insulating layer 20.

FIGS. 8A, 8B, 8C, 8D, 8E, 8F, 8G, 8H, and 8I are sectional views illustrating a process of fabricating the display panel DP according to an exemplary embodiment of the invention. For convenience in comparison, each of FIGS. 8A, 8B, 8C, 8D, 8E, and 8F illustrates a corresponding region of FIG. 3. For concise description, an element previously described with reference to FIGS. 1, 2, 3, 4, 5, 6A, 6B, and 7 may be identified by the same reference number without repeating an overlapping description thereof.

Figure 8A:
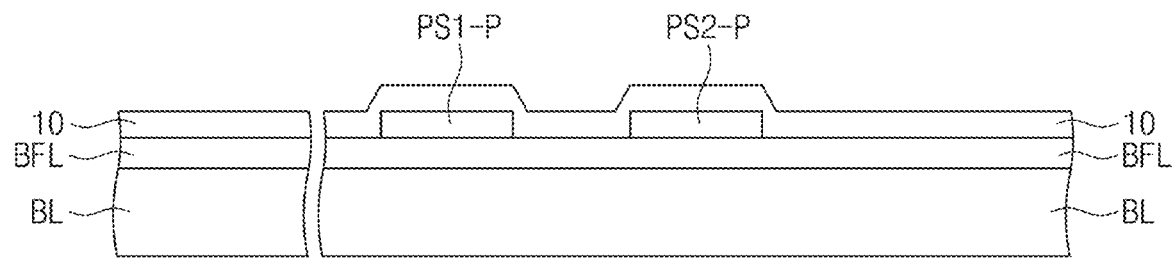
FIGS. 8A, 8B, 8C, 8D, 8E, 8F, 8G, 8H, and 8I are sectional views illustrating a process of fabricating a display panel constructed according to an exemplary embodiment of the invention.

As shown in FIG. 8A, an inorganic layer may be formed on the base layer BL. In an exemplary embodiment, a plurality of inorganic layers may be formed by depositing respective inorganic materials. For example, the buffer layer BFL may be formed by sequentially forming a silicon oxide layer and a silicon nitride layer.

As shown in FIG. 8A, a first preliminary semiconductor pattern PS1-P and a second preliminary semiconductor pattern PS2-P may be formed on the buffer layer BFL. The first preliminary semiconductor pattern PS1-P and the second preliminary semiconductor pattern PS2-P may be formed by forming and patterning a semiconductor layer. A crystallization process may be performed to change a crystalline structure of the semiconductor layer, before or after the patterning of the semiconductor layer.

As shown in FIG. 8A, the first insulating layer 10 may be formed on the buffer layer BFL. The first insulating layer 10 may be formed by a deposition, coating, or printing method. The method of forming the first insulating layer 10 may be changed in consideration of a material of the first insulating layer 10.

Figure 8B:
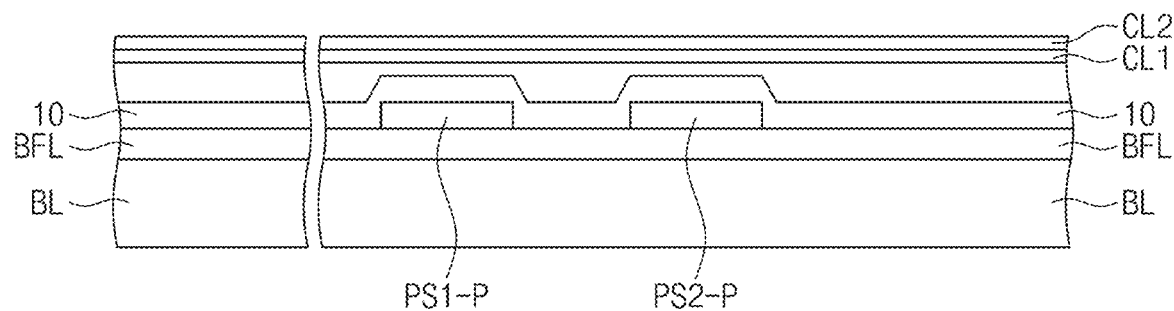

Thereafter, as shown in FIG. 8B, the first layer CL1 and the second layer CL2 may be continuously formed on the first insulating layer 10 in a way of reducing an interval between respective processes. The first layer CL1 may be formed by depositing aluminum. In an exemplary embodiment, the first layer CL1 may be formed by depositing an aluminum-nickel-lanthanum alloy.

The second layer CL2 may be formed by depositing a niobium-titanium alloy. The deposition processes of the first layer CL1 and the second layer CL2 may be performed using a plasma deposition process, but the exemplary embodiments are not limited thereto. In an exemplary embodiment, the first layer CL1 and the second layer CL2 may be deposited or formed using one of various methods known to a skilled person in this art.

Figure 8C:
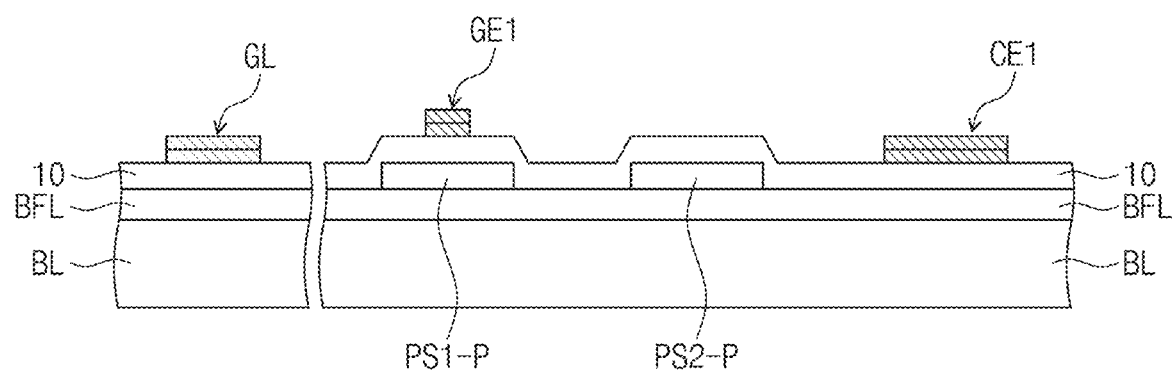

Thereafter, as shown in FIG. 8C, the first layer CL1 and the second layer CL2 may be patterned. As a result of the patterning, the first control electrode GE1 and the first electrode CE1 may be formed from the first layer CL1 and the second layer CL2. The patterning may be performed using one of conventional wet or dry etching methods. In an exemplary embodiment, a dry etching process may be used to pattern the first layer CL1 and the second layer CL2. According to an exemplary embodiment of the invention, the first layer CL1 and the second layer CL2 may be etched at a time, and thus, it may be possible to simplify a fabrication process.

Figure 8D:
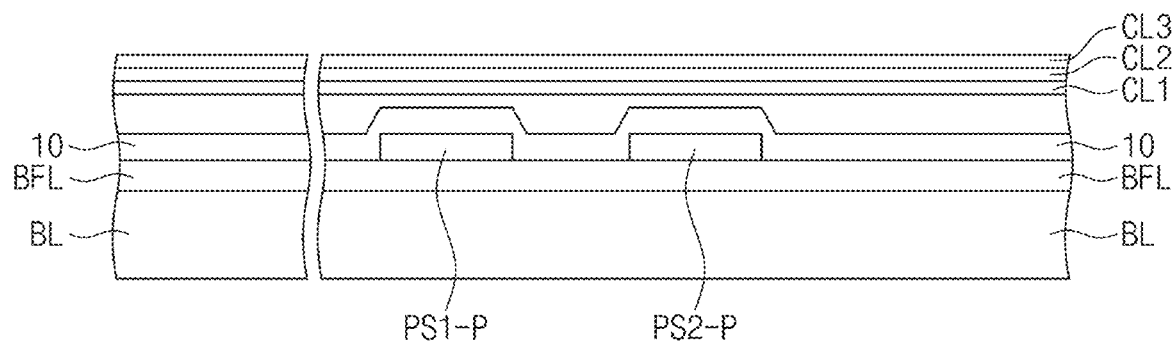

Referring to FIG. 8D, the third layer CL3 may be further formed on the second layer CL2. The first layer CL1, the second layer CL2, and the third layer CL3 may be continuously formed. In an exemplary embodiment, the third layer CL3 may be formed by deposing a titanium layer using a plasma deposition method, but the exemplary embodiments are not limited thereto. For example, the third layer CL3 may be deposited or formed using one of various methods known to a skilled person in this art.

Figure 8E:
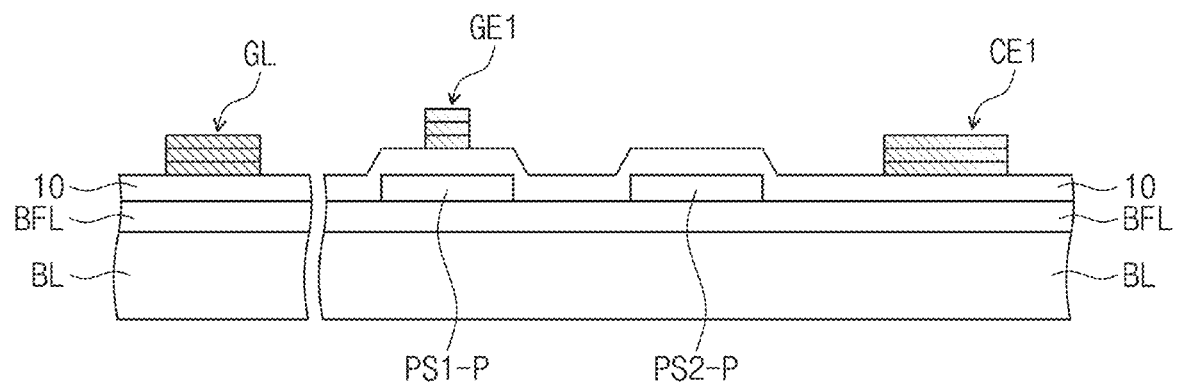

Thereafter as shown in FIG. 8E, the first layer CL1, the second layer CL2 and the third layer CL3 may be patterned. As a result of the patterning, the first control electrode GE1 and the first electrode CE1 may be formed from the first layer CL1, the second layer CL2, and the third layer CL3. The patterning may be performed using one of conventional wet or dry etching methods. In an exemplary embodiment, a dry etching process may be used to pattern the first layer CL1, the second layer CL2, and the third layer CL3. According to an exemplary embodiment of the invention, the first layer CL1, the second layer CL2, and the third layer CL3 may be etched at a time, and thus, it may be possible to simplify a fabrication process.

Figure 8F:
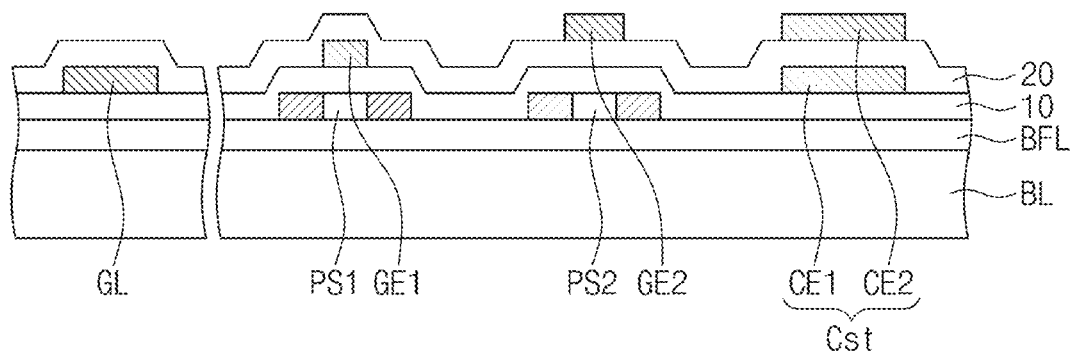

Thereafter, as shown in FIG. 8F, the second insulating layer 20 may be formed on the first insulating layer 10. The second insulating layer 20 may be formed by a deposition, coating, or printing process. Next, the second control electrode GE2 and the second electrode CE2 may be formed on the second insulating layer 20. The second control electrode GE2 and the second electrode CE2 may have a single- or multi-layered structure. In the case where the process of FIGS. 8B to 8E is used, the second control electrode GE2 and the second electrode CE2 may be formed to have a double-layered structure.

Next, the first preliminary semiconductor pattern PS1-P and the second preliminary semiconductor pattern PS2-P may be doped using the first control electrode GE1 and the second control electrode GE2 as a doing mask. Thus, the first and second preliminary semiconductor patterns PS1-P and PS2-P may include portions, which are overlapped with the first and second control electrodes GE1 and GE2 and are used as channel regions, and doped portions, which are located at both sides of the channel region and are used as input and output regions. In the illustrated exemplary embodiment, n-type dopants (i.e., group V elements) may be used for the doping process.

Thereafter, a thermal treatment process may be performed. The thermal treatment process may be performed to thermally treat the first semiconductor pattern PS1 and the second semiconductor pattern PS2 at a temperature ranging from about 400° C. to about 500° C. (in particular, at 450° C.). As a result of the thermal treatment process, dopants injected in the input and output regions may be uniformly diffused. As described above, in the case where conductive patterns contain a niobium-titanium alloy layer, it may be possible to prevent or reduce the hillock formation phenomenon from occurring in an aluminum-containing layer, even when the thermal treatment process is performed at a high temperature.

Figure 8G:
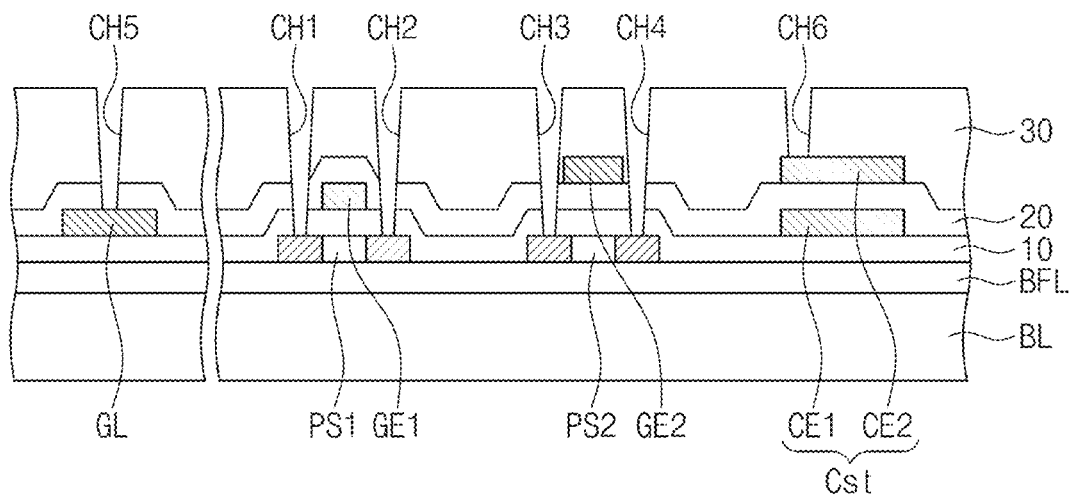

Next, as shown in FIG. 8G, the third insulating layer 30 may be formed on the second insulating layer 20. The third insulating layer 30 may be formed by a deposition, coating, or printing method. Thereafter, the first to sixth through holes CH1 to CH6 may be formed. Portions of the first semiconductor pattern PS1 and the second semiconductor pattern PS2 exposed by the first to fourth through holes CH1, CH2, CH3, and CH4 may be oxidized. A cleaning process may be performed to remove an oxide layer on the first and second semiconductor patterns PS1 and PS2, and this may make it possible to reduce contact resistances of the first and second semiconductor patterns PS1 and PS2. In an exemplary embodiment, the cleaning solution may be performed to remove a silicon dioxide layer formed near the first to fourth through holes CH1, CH2, CH3, and CH4.

The cleaning solution may be supplied near the fifth and sixth through holes CH5 and CH6, but owing to the presence of the niobium-titanium layer, the cleaning solution may be prevented from being reacted with an aluminum-containing layer. The niobium layer may prevent the aluminum layer from being damaged by a specific element (e.g., HF or NH$_4$F) in the cleaning solution.

Figure 8H:
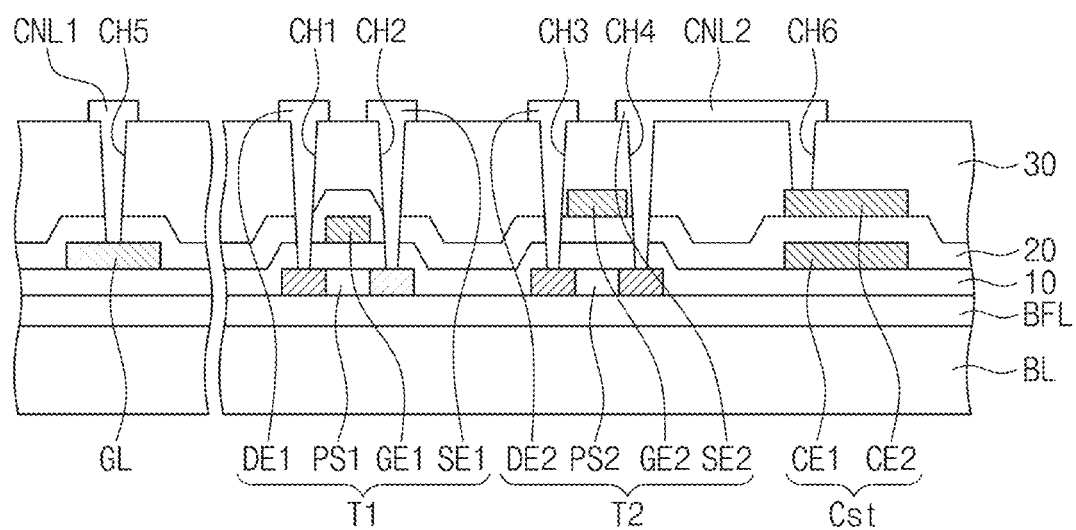

Thereafter, as shown in FIG. 8H, conductive patterns may be formed on the third insulating layer 30 by a deposition process. For example, the first input electrode DE1, the first output electrode SE1, the second input electrode DE2, the second output electrode SE2, the first connection signal line CNL1, and the second connection signal line CNL2 may be formed. The conductive patterns may have a triple-layered structure of Ti/Al/Ti.

Figure 8I:
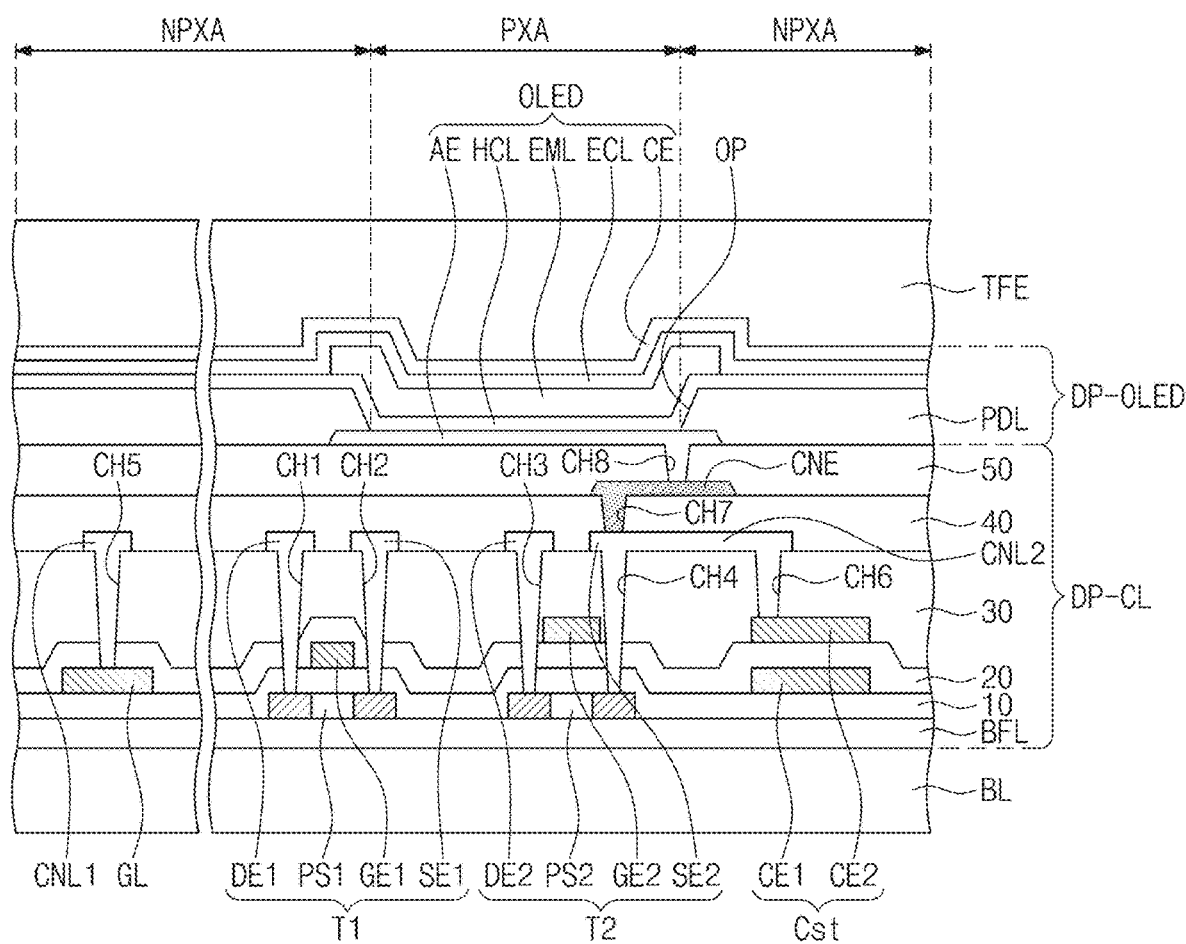

Thereafter, as shown in FIG. 8I, subsequent processes may be further performed to fabricate a display panel. For example, the fourth insulating layer 40 may be formed, and the seventh contact hole CH7 may be formed. The connection electrode CNE may be formed on the fourth insulating layer 40. The fifth insulating layer 50 may be formed, and the eighth contact hole CH8 may be formed. Next, the organic light emitting diode OLED may be formed on the fifth insulating layer 50.

The anode AE may be formed on the fifth insulating layer 50. The anode AE may be connected to the connection electrode CNE through the eighth contact hole CH8. The pixel definition layer PDL may be formed on the fifth insulating layer 50 to expose a center portion of the anode AE.

Thereafter, the hole control layer HCL, the light emitting layer EML, the electron control layer ECL, and the cathode CE may be sequentially formed. The thin encapsulation layer TFE may be formed on the cathode CE. An organic encapsulation layer and/or an inorganic encapsulation layer may be formed by, for example, a deposition or inkjet printing process According to an exemplary embodiment of the invention, the display panel may include a signal line having reduced electric resistance and improved signal transmission speed. Accordingly, it may be possible to reduce a signal delay issue in a high resolution display panel.

The signal line may include a first layer containing aluminum or aluminum alloy, and the signal line may have reduced electric resistance. In an exemplary embodiment, the first layer of the signal line may be formed of or include an aluminum-nickel-lanthanum alloy to suppress or prevent a hillock formation phenomenon.

The signal line may further include a niobium-titanium alloy layer directly disposed on the aluminum layer or aluminum alloy layer to more effectively suppress or prevent the hillock formation phenomenon from occurring in the signal line. Furthermore, by performing a cleaning process, it may be possible to prevent or limit the niobium-titanium alloy layer from being react with a cleaning solution, an aluminum layer, or an aluminum alloy.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
    a base layer;
    a signal line disposed on the base layer, the signal line comprising:
        a first layer comprising aluminum and nickel, the content of the nickel relative to the first layer ranging from 0.01 at % to 0.05 at %; and
        a second layer disposed directly on the first layer, the second layer comprising a niobium-titanium alloy directly contacting the first layer;
    a first thin film transistor connected to the signal line;
    a second thin film transistor disposed on the base layer;
    a capacitor electrically connected to the second thin film transistor; and
    a light emitting element electrically connected to the second thin film transistor.

2. The display panel of claim 1, wherein the first thin film transistor comprises:
    a first poly silicon pattern disposed on the base layer;
    a first control electrode overlapping the first poly silicon pattern and connected to the signal line; and
    a first input electrode and a first output electrode, each of which is connected to the first poly silicon pattern.

3. The display panel of claim 2, wherein the first control electrode has substantially a same stacking structure as the signal line.

4. The display panel of claim 2, wherein the second thin film transistor comprises:
- a second poly silicon pattern disposed on the base layer;
- a second control electrode overlapping the second poly silicon pattern and disposed on a layer different from that under the first control electrode;
- a second input electrode and a second output electrode, each of which is connected to the second poly silicon pattern.

5. The display panel of claim 4, wherein the capacitor comprises:
- a first electrode disposed on substantially a same layer as that under the signal line; and
- a second electrode disposed on substantially a same layer as that under the second control electrode, and
wherein the first electrode has substantially a same stacking structure as the signal line.

6. The display panel of claim 5, wherein the second control electrode and the second electrode comprise:
- a first layer comprising an aluminum-nickel-lanthanum alloy; and
- a second layer disposed directly on the first layer and comprising a niobium-titanium alloy.

7. The display panel of claim 1, wherein the first layer further comprises:
lanthanum, the content of the lanthanum relative to the first layer ranging from 0.02 at % to 0.05 at %.

8. The display panel of claim 7, wherein:
- the content of the titanium relative to the second layer ranges from 5 at % to 50 at %; and
- the content of the niobium relative to the second layer ranges from 50 at % to 95 at %.

9. The display panel of claim 1, wherein the signal line has a line width that ranges from 3 μm to 5 μm.

10. The display panel of claim 1, wherein:
the thickness of the first layer ranges from 1000 Å to 3000 Å; and
the second layer has a thickness that ranges from 300 Å to 1000 Å.

11. The display panel of claim 1, further comprising a third layer disposed on the second layer, the third layer comprising titanium.

12. The display panel of claim 11, wherein:
the first layer has a thickness that ranges from 1000 Å to 3000 Å;
the second layer has a thickness that ranges from 200 Å to 400 Å; and
the third layer has a thickness that ranges from 300 Å to 800 Å.

13. The display panel of claim 1, wherein the signal line comprises at least one of a data line, a gate line, a control signal line, a power line, and a connecting line.

14. A display panel, comprising:
a base layer;
a first thin film transistor disposed on the base layer;
a second thin film transistor electrically connected to the first thin film transistor; and
a light emitting element connected to the second thin film transistor,
wherein the first thin film transistor comprises:
- a first poly silicon pattern disposed on the base layer;
- a first control electrode overlapping the first poly silicon pattern, the first control electrode comprising:
  - a first layer comprising an aluminum-nickel-lanthanum alloy, the content of the nickel relative to the first layer ranging from 0.01 at % to 0.05 at %; and
  - a second layer disposed directly on the first layer, the second layer comprising a niobium-titanium alloy directly contacting the first layer; and
- a first input electrode and a first output electrode, each of which is connected to the first poly silicon pattern.

15. The display panel of claim 14, wherein the first thin film transistor further comprises a third layer disposed directly on the second layer, the third layer comprising titanium.

* * * * *